United States Patent
Sorg

(10) Patent No.: US 6,746,295 B2
(45) Date of Patent: Jun. 8, 2004

(54) METHOD OF PRODUCING AN LED LIGHT SOURCE WITH LENS

(75) Inventor: Jörg-Erich Sorg, Pentling (DE)

(73) Assignee: Osram-Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 10/454,919

(22) Filed: Jun. 5, 2003

(65) Prior Publication Data

US 2003/0211804 A1 Nov. 13, 2003

Related U.S. Application Data

(62) Division of application No. 10/007,398, filed on Oct. 22, 2001, which is a continuation of application No. PCT/DE00/01079, filed on Apr. 7, 2000.

(30) Foreign Application Priority Data

Apr. 22, 1999 (DE) .......................... 199 18 370

(51) Int. Cl.⁷ .............................. H01J 9/00; H05B 33/10
(52) U.S. Cl. ................... 445/24; 445/25; 257/98; 257/100; 438/26; 438/27; 438/29
(58) Field of Search ................ 340/815.57, 815.45, 340/815.54, 815.76; 438/22, 26, 27, 29; 445/24, 25; 257/95, 98, 100

(56) References Cited

U.S. PATENT DOCUMENTS

| | | | |
|---|---|---|---|
| 3,875,456 A | 4/1975 | Kano et al. ............. | 313/501 |
| 5,043,716 A | 8/1991 | Latz et al. ............. | 313/512 |
| 5,847,507 A | 12/1998 | Butterworth et al. ..... | 313/512 |
| 6,155,699 A | 12/2000 | Miller et al. ............. | 362/293 |

FOREIGN PATENT DOCUMENTS

| | | | | |
|---|---|---|---|---|
| DE | 196 38 667 A1 | 4/1998 | ........... | H01L/33/00 |
| EP | 0 230 336 A1 | 7/1987 | ........... | H01L/33/00 |
| EP | 0 854 523 A2 | 7/1998 | ........... | H01L/33/00 |
| JP | 62-196878 A | 8/1987 | ........... | H01L/33/00 |
| JP | 10 065 221 A | 3/1998 | | |
| JP | 10 188 649 A | 7/1998 | | |
| JP | 2003124525 A | * 4/2003 | ........... | H01L/33/00 |
| WO | WO 83/00408 | 2/1983 | ........... | H01L/31/02 |

OTHER PUBLICATIONS

Willy Reisen: "Lumineszenz–Dioden—die Leuchtmittel von morgen?" [Light Emitting Diodes—The Light Source of the Future?], Licht, 4/98, pp. 302–304.

Frank Möllmer et al.: "Siemens SMT–TOPLED für die Oberflächenmontage" [Siemens SMT–TOPLED for Surface Mounting], Siemens Components, vol. 29, 1991, No. 4, pp. 147–149.

Frank Möllmer et al.: "Siemens SMT–TOPLED für die Oberflächenmontage" [Siemens SMT–TOPLED for Surface Mounting], Siemens Components, vol. 29, 1991, No. 5, pp. 193–196.

* cited by examiner

Primary Examiner—Kenneth J. Ramsey
Assistant Examiner—Mariceli Santiago
(74) Attorney, Agent, or Firm—Laurence A. Greenberg; Werner H. Stemer; Gregory L. Mayback

(57) ABSTRACT

The light source has an LED, preferably produced for the surface-mounting technique, embedded in a transparent material filling. A converter substance is integrated in the filling for the at least partial wavelength conversion of the light emitted by the LED. A lens is glued onto the transparent material filling. The material filling has a convex surface and the lens has a concave underside entering into a form fit with the convex surface of the material filling.

17 Claims, 1 Drawing Sheet

METHOD OF PRODUCING AN LED LIGHT SOURCE WITH LENS

CROSS-REFERENCE TO RELATED APPLICATION

This application is a division of U.S. application Ser. No. 10/007,398, filed Oct. 22, 2001, which was a continuation of International Application PCT/DE00/01079, filed Apr. 7, 2000, which designated the United States, and which was not published in English.

BACKGROUND OF THE INVENTION

FIELD OF THE INVENTION

The invention relates to a light source and, more particularly, to an LED light source, with at least one LED, a basic body formed with a recess wherein the LED is arranged, a filling of transparent material which embeds the LED and wherein a converter substance for the at least partial wavelength conversion of the light emitted by the LED is contained, and a lens in contact with the material filling.

LEDs (light-emitting diodes) based on GaN, with which blue or ultraviolet light can be generated, have recently been developed. With the aid of these LEDs, light sources can be produced on the basis of wavelength conversion. A concept, which has already been realized provides that part of the blue light emitted from the LED is converted into yellow light by a suitable converter material, so that white light is generated as a consequence of the resultant color mixing of the original blue light with the converted yellow light. In a second concept, it is proposed to convert ultraviolet light of a suitable LED into the visible spectral range.

The converter material, in the case of both concepts, may either be contained in the semiconductor material of the LED or in an embedding material of resin or the like surrounding the LED.

To increase the radiation intensity of the component in the emission direction, the LED components may be provided with an optical lens, by which the light is focused and emitted in a directed manner.

An example of a form of construction of this type is represented in FIG. 1. There, a form of LED construction is illustrated that is described, for example, in the article "SIEMENS SMT-TOPLED fur die Oberflächenmontage" [SIEMENS SMT-TOPLED for surface mounting] by F. M öllmer and G. Waitl in the journal Siemens Components 29 (1991), issue 4, page 147 in connection with FIG. 1. That form of LED is extremely compact and, if appropriate, allows the arrangement of a large number of LEDs of this type in a linear array or a matrix array.

In the case of a SMT-TOPLED of the configuration shown in FIG. 1, an LED 2 is mounted with one of its electrical contact areas on a leadframe 5, which is connected to one pole of a voltage source, while an opposite leadframe 5, connected to the other pole of the voltage source, is connected by a bonding wire 6 to the other electrical contact area of the LED 2. The two leadframes 5 are encapsulated in a high-temperature-resistant thermoplastic. In this way, a basic body 1, wherein there is a recess 1A into which the LED 2 protrudes from the inside is formed by injection molding. The thermoplastic preferably has a high diffuse reflectance of approximately 90%, so that the light emitted by the LED 2 can be additionally reflected at the sloping side walls of the recess 1A in the direction of the outlet opening.

The recess 1A is filled with a transparent resin material 3, such as an epoxy resin, which contains a converter material, for example a suitable dye. The resin material and the thermoplastic are carefully matched with each other, in order that even peak thermal loads do not lead to mechanical problems.

During operation, blue or ultraviolet light is emitted by the LED 2, which may be produced for example on the basis of GaN or on the basis of II–VI compounds. On its path from the LED 2 to the lens 4, the relatively short-wave emitted light radiation is partially converted into longer-wave light radiation in the resin filling 3 containing the converter material. In particular, if a blue LED is used, such a converter material by which the blue light radiation is converted at least partially into yellow light radiation can be used. One problem of this type of construction, however, is that the light rays are subject to different path lengths in the resin filling 3 filled with the converter material from the LED 2 to the lens 4. These have the result that the yellow fraction in the light radiation predominates in the outer region of the component, whereas by contrast, the blue fraction in the light radiation predominates in the center. This effect consequently leads to a color locus of the emitted light radiation varying with the direction of emission or direction of viewing.

U.S. Pat. No. 3,875,456 discloses semiconductor light sources which have two semiconductor elements arranged in a housing or reflector. The semiconductor elements are embedded in a scattering layer, downstream of which there is a covering formed similar to a lens. The scattering layer and the covering may be formed by resin layers applied one on top of the other and contain phosphorescent materials.

U.S. Pat. No. 5,847,507 describes a light-emitting diode wherein the semiconductor element is enveloped by a covering in lens form, for example of epoxy resin, which contains fluorescent materials.

European patent publication EP 0 230 336 shows a component which has a substrate on which an annular spacer and an optoelectronic element are fastened. The optoelectronic element is arranged inside the annular opening. The annular opening is filled with a transparent compound and is closed off by a spherical lens, which is mounted on the annular spacer, lying opposite the substrate, and is in contact with the transparent compound.

SUMMARY OF THE INVENTION

It is accordingly an object of the invention to provide an LED light source, which overcomes the above-mentioned disadvantages of the heretofore-known devices and methods of this general type and wherein the path length of the radiation through the converter material is essentially equal and the light radiation can be emitted in a focused form. In addition, a method of producing a light source of this type is to be specified.

With the foregoing and other objects in view there is provided, in accordance with the invention, an LED light source, comprising:

a basic body formed with recess;

an LED disposed in the recess;

a filling of a transparent material embedding the LED and a converter substance in the transparent material for at least partially converting a wavelength of light emitted by the LED;

a lens in contact with the filling, the lens being prefabricated and having a definitively preformed concave underside and being placed on the material filling prior to a final curing of the material filling, whereby an upper side of the material filling enters into a form fit with the concave underside of the lens and has a convex surface formed by the underside of the lens.

In accordance with an added feature of the invention, a volume of the filling is less than a free volume of the recess with the LED disposed therein.

In accordance with an additional feature of the invention, the convex surface of the filling and the underside of the lens are formed to have a substantially constant distance from the LED.

In other words, the filling has a convex upper surface defined by substantially equidistant points from the LED, i.e., it is approximately spherical with the LED forming the center of the sphere.

In accordance with another feature of the invention, the LED has an active radiating area and the convex surface of the filling and the underside of the lens are formed at a substantially constant distance from a geometrical center point of the active radiating area of the LED.

In accordance with a further feature of the invention, the LED is a blue light-emitting LED based on GaN and the converter substance converts light radiation in the blue spectral range into light radiation in the yellow spectral range. In an alternative embodiment, the LED is a UV-emitting LED and the converter substance converts UV light into a visible spectral range.

In accordance with again an added feature of the invention, a distance of the convex surface from the LED is set such that a degree of conversion along an optical path length of the light radiation is substantially 50%.

In accordance with again an additional feature of the invention, the LED has an active radiating area and a distance of the convex surface from a geometrical center point of the active radiating area is set such that a degree of conversion along an optical path length of the light radiation is substantially 50%.

In accordance with again another feature of the invention, the light source is a surface-mounted component.

In accordance with again a further feature of the invention, the filling contains a resin material, in particular an epoxy resin. In a preferred embodiment, also, the basic body contains a thermoplastic material.

In accordance with yet an added feature of the invention, there is provided:
- a first leadframe carrying the LED at a first electrical contact area thereof;
- a second leadframe connected to a second electrical contact area of the LED by a bond wire; and
- wherein the basic body is produced by injection molding around the leadframes.

In accordance with yet an additional feature of the invention, the recess is defined by sloping and reflective side walls.

With the above and other objects in view there is also provided, in accordance with the invention, a method of producing an LED light source, which comprises the following steps:
- forming a recess with a planar bottom face in a basic body;
- mounting an LED on the bottom face;
- filling the recess with a defined amount of a transparent material, such as a resin material, containing converter material;
- providing a lens with a concave underside;
- inserting the lens with the concave underside into the still liquid transparent material; and
- curing the transparent material.

Other features which are considered as characteristic for the invention are set forth in the appended claims.

Although the invention is illustrated and described herein as embodied in LED light source with lens and a method of producing the light source, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a vertical section through an exemplary prior art embodiment of an LED light source with a lens glued on.

DESCRIPTION OF THE PREFERRED EMBODIMENTS

Figure 1:
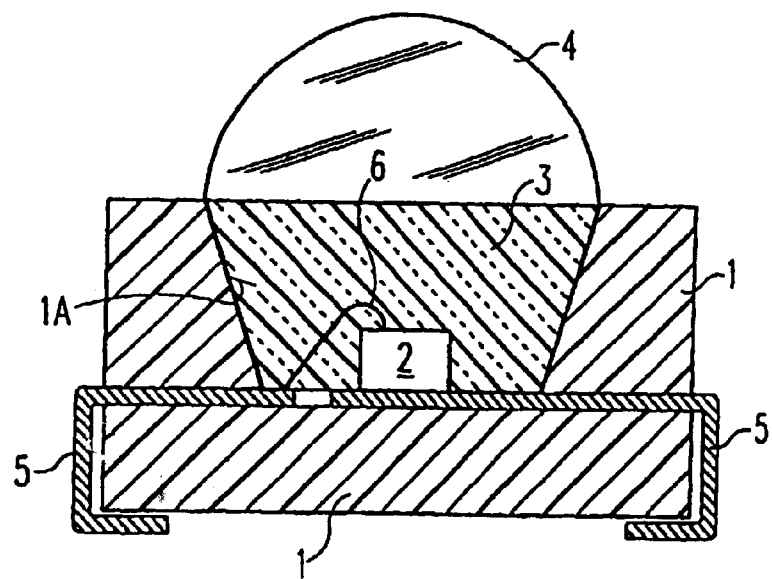
Figure 2:
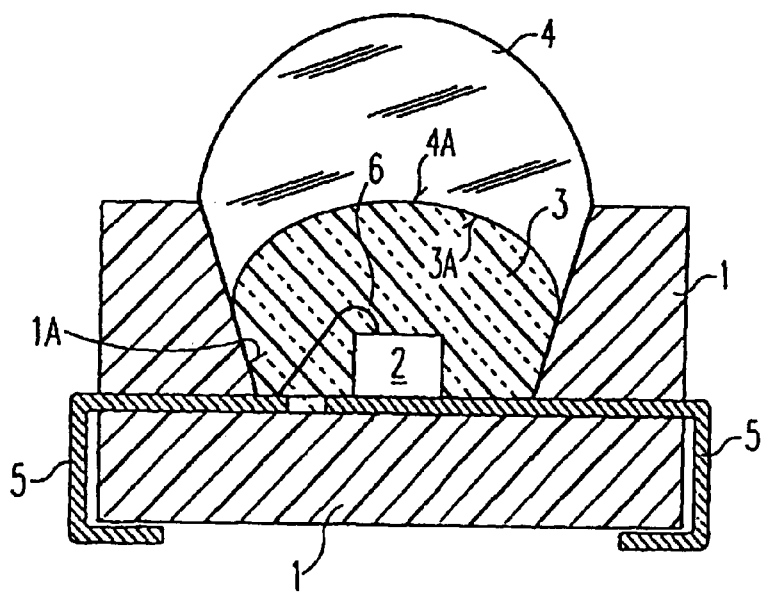
FIG. 2 is a vertical section through an embodiment of an LED light source according to the invention.

Referring now to the figures of the drawing in detail, there is shown in FIG. 2 an embodiment according to the present invention wherein the same reference numerals are allocated for identical and functionally identical elements as in the above description of the light source of FIG. 1. All the advantageous features mentioned with reference to the form of construction of FIG. 1 can also be used in the case of the form of construction according to the invention of FIG. 2.

The light source according to the invention of FIG. 2 solves the stated problem in that the path length of the light radiation in the resin filling 3 is unified. To achieve this, the resin filling 3 is produced with a convex surface 3A, which has essentially the same distance from the LED 2 at every point. The volumetric proportion of the converter material contained in the resin filling is set such that an adequately large fraction of the blue light radiation is converted into yellow light radiation along this unified path length from the LED 2 to the convex surface 3A of the resin filling 3, so that the radiation is perceived by the human eye as white-light radiation. Consequently, on account of the blue-yellow color mixing of the same proportions, at every point of the convex surface 3A white light enters the lens 4 located above it.

The lens 4, produced for example from polycarbonate, has by contrast a concave surface 4A, which enters into a form fit with the convex surface 3A of the resin filling 3.

The light source according to the invention as shown in FIG. 2 can be produced in the following way:

An LED 2 is electrically connected in the way already described to leadframes 5 and the leadframes 5 are encapsulated by a thermoplastic material in such a way that a basic body 1 is formed. The LED 2 is located in a recess 1A of the basic body 1. To this extent, the method has already been described in the above-cited article by Möllmer and Waitl. Then, however, the resin material 3 is not made to fill the recess 1A up to the rim but only up to a precisely fixed filling height below it. Then, a prefabricated lens 4, which has the form shown in FIG. 2 with the concave underside 4A, is inserted into the still liquid resin material 3, the surface of the resin filling coming into contact with the concave underside 4A of the lens 4, so that as a result the convex surface 3A of the resin filling 3 is produced. After the lens 4 has been inserted, the resin filling is cured.

The amount of resin material 3 with which the recess 1A is filled must be set as accurately as possible in such a way that the missing volume up to the rim of the recess 1A corresponds to the displacement volume of the portion of the lens 4 forming the concave underside 4A.

The form of the convex surface 3A of the resin filling 3 and of the concave underside 4A of the lens 4 is already fixed in the production of the lens 4. The condition, which this form has to meet is that the distance of the actual light source, that is the active radiating area of the LED, from these surfaces is constant. For this purpose, the active radiating surface of the LED may be assumed to be punctiform and situated at the center point of the active radiating area.

It should be understood that the present invention is not restricted to the SMT form of construction represented in FIG. 2. For example, the basic body may also be formed by a metallic block, such as a copper block, which has a recess, on the bottom face of which the LED is mounted with one of its electrical contact areas, so that the copper block is at the same time a heat sink and electrical terminal. The other electrical terminal could then be formed on an outer surface of the copper block with an insulating layer lying in between, this electrical terminal being connected to the other contact area of the LED by a bonding wire before the resin filling operation.

I claim:

1. A method of producing an LED light source, which comprises the following steps:

forming a recess with a planar bottom face in a basic body;

mounting an LED on the bottom face;

filling the recess with a defined amount of a transparent material containing converter material;

providing a lens with a concave underside;

while the transparent material is still in a liquid form, inserting the lens with the concave underside into the transparent material; and curing the transparent material.

2. The method according to claim 1, wherein the transparent material is a resin material.

3. The method according to claim 1, wherein during the step of curing the transparent material, an upper side of the transparent material enters into a form fit with the concave underside of the lens and the concave underside of the lens causes the upper side of the transparent material to form into a convex surface.

4. The method according to claim 1, wherein the converter material is for at least partially converting a wavelength of light emitted by the LED.

5. The method according to claim 1, which comprises fabricating the lens before performing the step of inserting the lens with the concave underside into the transparent material.

6. The LED light source according to claim 1, wherein the defined amount of the transparent material is less than a free volume of the recess with the LED disposed therein.

7. The method according to claim 1, which comprises:

during the step of curing the transparent material, ensuring that an upper side of the transparent material enters into a form fit with the concave underside of the lens and the concave underside of the lens causes the upper side of the transparent material to form into a convex surface; and ensuring that the convex surface of the transparent material and the concave underside of the lens have a substantially constant distance from the LED.

8. The method according to claim 1, which comprises:

during the step of curing the transparent material, ensuring that an upper side of the transparent material enters into a form fit with the concave underside of the lens and the concave underside of the lens causes the upper side of the transparent material to form into a convex surface;

providing the LED with an active radiating area; and ensuring that the convex surface of the transparent material and the concave underside of the lens are formed at a substantially constant distance from a geometrical center point of the active radiating area of the LED.

9. The method according to claim 1, which comprises:

providing the LED as a blue light-emitting LED based on GaN; and providing the converter material for converting light radiation in a blue spectral range into light radiation in a yellow spectral range.

10. The method according to claim 1, which comprises:

providing the LED as a UV-emitting LED; and providing the converter material for converting UV light into a visible spectral range.

11. The method according to claim 1, which comprises:

during the step of curing the transparent material, ensuring that an upper side of the transparent material enters into a form fit with the concave underside of the lens and the concave underside of the lens causes the upper side of the transparent material to form into a convex surface; and setting a distance of the convex surface from the LED such that a degree of conversion along an optical path length of light radiated from the LED is substantially 50%.

12. The method according to claim 1, which comprises:

during the step of curing the transparent material, ensuring that an upper side of the transparent material enters into a form fit with the concave underside of the lens and the concave underside of the lens causes the upper side of the transparent material to form into a convex surface;

providing the LED with an active radiating area; and setting a distance of the convex surface from a geometrical center point of the active radiating area such that a degree of conversion along an optical path length of the light radiated from the LED is substantially 50%.

13. The method according to claim 1, which comprises providing the LED as a surface-mounted component.

14. The method according to claim 1, which comprises constructing the transparent material from a resin material.

15. The method according to claim 1, which comprises constructing the basic body from a thermoplastic material.

16. The method according to claim 1, which comprises:

mounting the LED on a first leadframe and electrically connecting the first leadframe to a first electrical contact area of the LED;

using a bond wire to electrically connect a second leadframe to a second electrical contact area of the LED; and producing the basic body by injection molding around the first leadframe and the second leadframe.

17. The method according to claim 1, which comprises providing the basic body with sloping and reflective side walls that define the recess.

* * * * *

UNITED STATES PATENT AND TRADEMARK OFFICE
CERTIFICATE OF CORRECTION

PATENT NO. : 6,746,295 B2
DATED : June 8, 2004
INVENTOR(S) : Jörg-Erich Sorg

It is certified that error appears in the above-identified patent and that said Letters Patent is hereby corrected as shown below:

<u>Title page,</u>
Item [73], Assignee, should read as follows:
-- Osram-Opto Semiconductors GmbH, Regensburg (DE) --

Signed and Sealed this

Sixteenth Day of November, 2004

JON W. DUDAS
*Director of the United States Patent and Trademark Office*